United States Patent
Feiweier

(10) Patent No.: US 7,960,971 B2
(45) Date of Patent: Jun. 14, 2011

(54) METHOD AND MAGNETIC RESONANCE SYSTEM FOR DETERMINING THE FLIP ANGLE DISTRIBUTION IN A VOLUME OF AN EXAMINATION SUBJECT

(75) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 157 days.

(21) Appl. No.: 12/358,546

(22) Filed: Jan. 23, 2009

(65) Prior Publication Data

US 2009/0121714 A1    May 14, 2009

Related U.S. Application Data

(62) Division of application No. 11/545,232, filed on Oct. 10, 2006, now Pat. No. 7,482,805.

(30) Foreign Application Priority Data

Oct. 14, 2005   (DE) .......................... 10 2005 049 229

(51) Int. Cl.
     *G01V 3/00*          (2006.01)
(52) U.S. Cl. ......................................... 324/309; 324/307
(58) Field of Classification Search .......... 324/300–322; 600/407–445
See application file for complete search history.

(56) References Cited

U.S. PATENT DOCUMENTS

| | | | |
|---|---|---|---|
| 6,028,428 A | 2/2000 | Cunningham et al. | |
| 6,043,658 A | 3/2000 | Leussler | |
| 6,853,192 B2 | 2/2005 | Heid | |
| 7,038,453 B2 * | 5/2006 | Feiweier et al. | 324/314 |
| 7,064,546 B2 * | 6/2006 | Feiweier | 324/307 |
| 7,078,901 B2 * | 7/2006 | Feiweier et al. | 324/318 |
| 7,221,162 B2 * | 5/2007 | Feiweier et al. | 324/318 |

(Continued)

OTHER PUBLICATIONS

"B1 Homogenization at 3 T MRI Using a 16 Rung Transmit Array," Diehl et al, Proc. Intl. Soc. Mag. Reson. Med. 13 (2005) p. 2751.

*Primary Examiner* — Brij B Shrivastav
(74) *Attorney, Agent, or Firm* — Schiff Hardin LLP

(57) ABSTRACT

In a method for determination of flip angle distributions for various antenna transmission configurations in a magnetic resonance system, magnetic resonance measurements are implemented with the various transmission configurations, with the reception configuration being identical for all implemented magnetic resonance measurements, and all magnetic resonance measurements for the various transmission configurations are implemented with a specific pulse sequence. This pulse sequence is selected such that the total function that describes the dependency of the image signal at a specific location on the flip angle achieved at this location with the radiated radio-frequency field, as well as on further MR-relevant parameters, can be factored into a first sub-function that describes the dependency of the image signal on the achieved flip angle and a second sub-function (Tb) that describes the dependency of the image signal on the further MR-relevant parameters, and such that the functional dependency of the image signal on the achieved flip angle is known. The absolute flip angle distribution is measured for a reference transmission configuration, and the flip angle distributions of the other transmission configurations are then respectively determined on the basis of the absolute flip angle distribution of the reference transmission configuration and on the basis of the ratio of the spatially-dependent image signals of the magnetic resonance measurements of the respective transmission configuration to the corresponding spatially-dependent image signals of the magnetic resonance measurement of the reference transmission configuration.

4 Claims, 4 Drawing Sheets

U.S. PATENT DOCUMENTS

| | | | |
|---|---|---|---|
| 7,446,527 B2 * | 11/2008 | Kabasawa | 324/309 |
| 7,482,805 B2 * | 1/2009 | Feiweier | 324/307 |
| 7,550,973 B2 * | 6/2009 | Greim et al. | 324/309 |
| 7,603,157 B2 * | 10/2009 | Feiweier et al. | 600/410 |
| 2004/0164737 A1 | 8/2004 | Feiweier | |
| 2005/0073304 A1 | 4/2005 | Feiweier et al. | |
| 2005/0083054 A1 | 4/2005 | Feiweier et al. | |
| 2005/0272998 A1 | 12/2005 | Diehl et al. | |
| 2007/0299332 A1 * | 12/2007 | Ikeda | 600/410 |
| 2008/0231273 A1 * | 9/2008 | Kabasawa | 324/309 |
| 2010/0039110 A1 * | 2/2010 | Takahashi et al. | 324/310 |

* cited by examiner

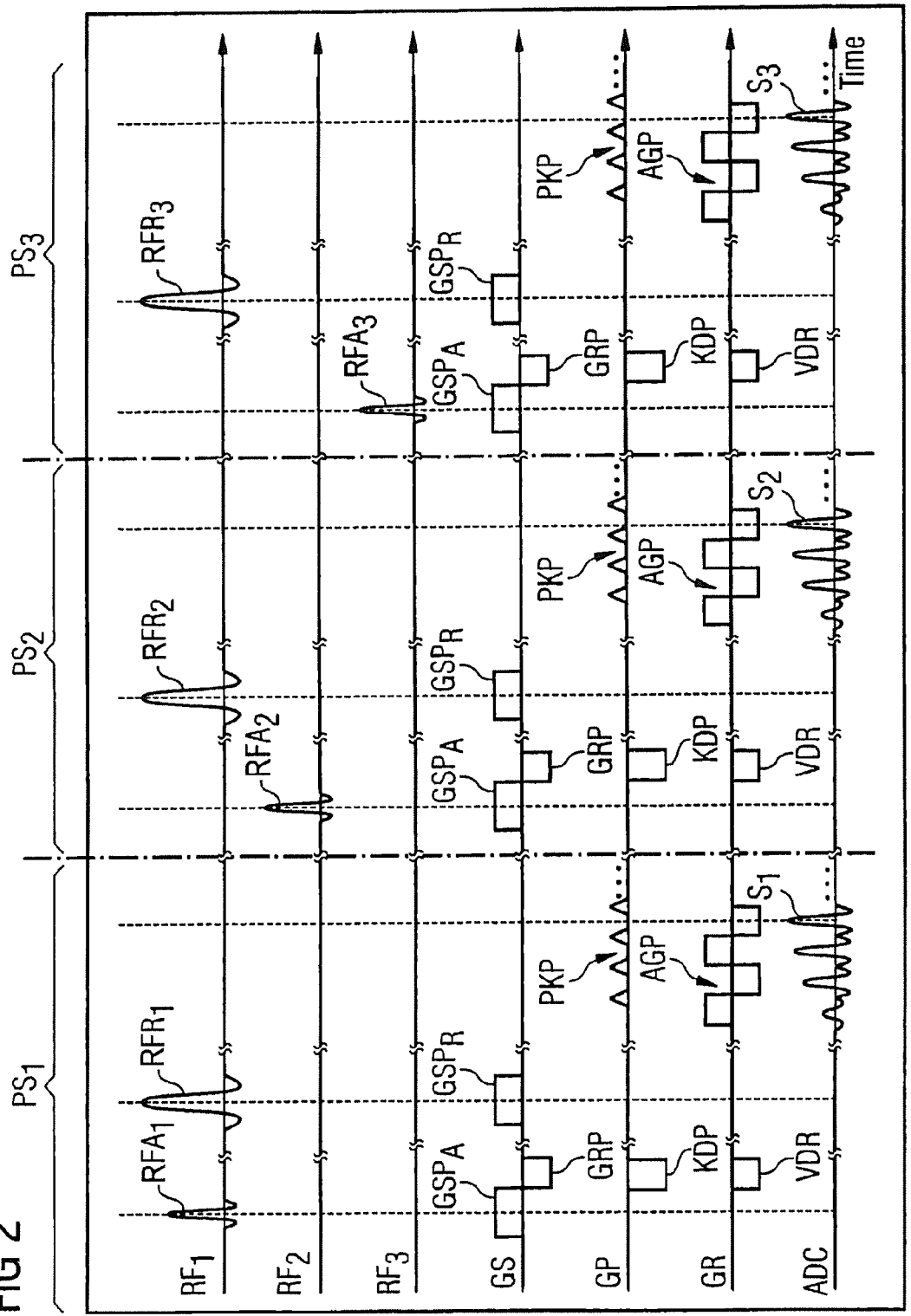

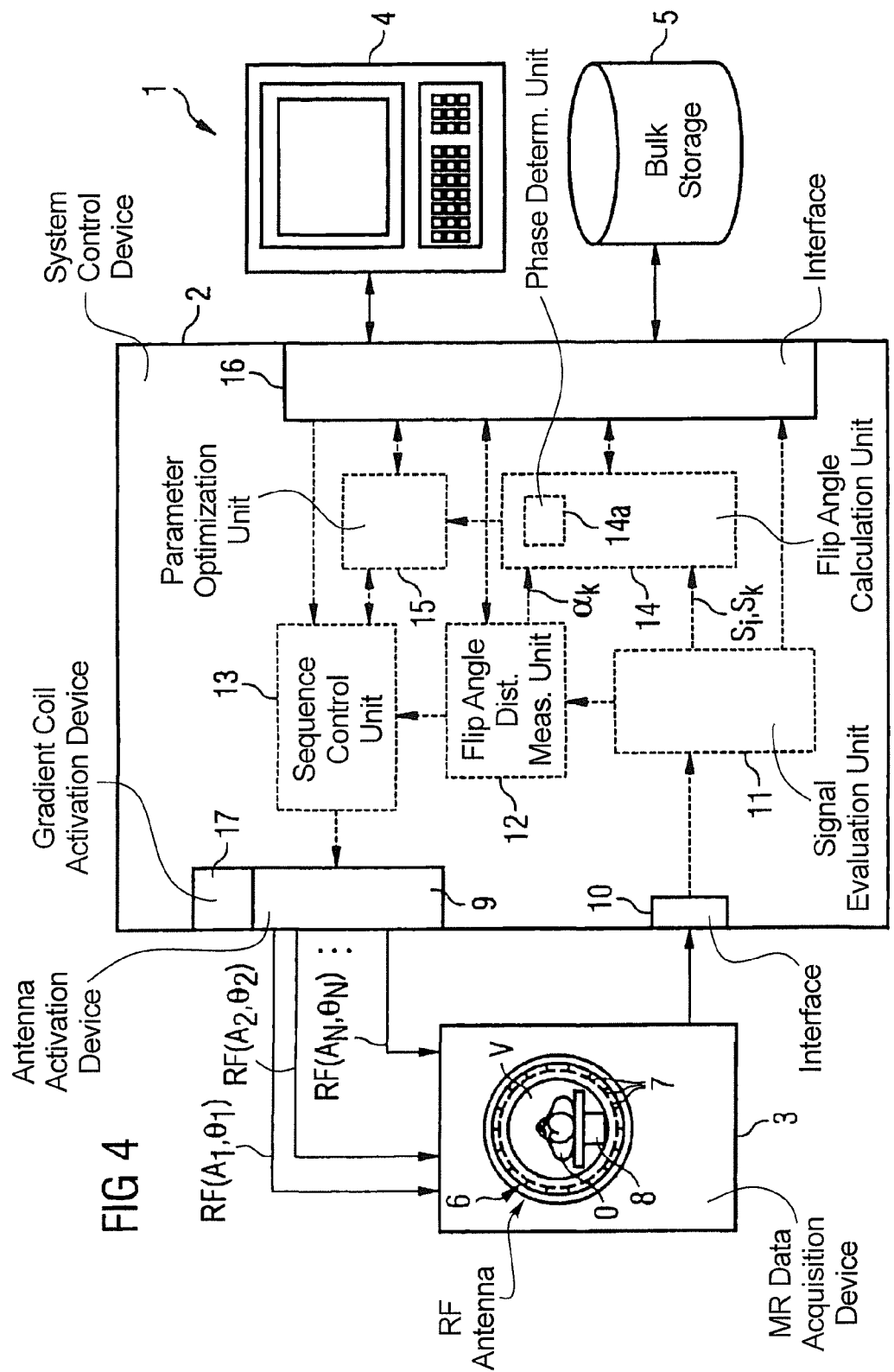

METHOD AND MAGNETIC RESONANCE SYSTEM FOR DETERMINING THE FLIP ANGLE DISTRIBUTION IN A VOLUME OF AN EXAMINATION SUBJECT

RELATED APPLICATION

The present application is a divisional of Ser. No. 11/545,232, filed Oct. 10, 2006 now U.S. Pat. No. 7,482,805.

BACKGROUND OF THE INVENTION

1. Field of the Invention

The present invention concerns a method for determining flip angle distributions for various antenna transmission configurations in at least one specific volume region within an examination subject in a magnetic resonance system, wherein the magnetic resonance system has a radio-frequency antenna with a number of resonator elements that (in different transmission configurations) can be excited individually or in groups for generation of linearly-independent radio-frequency field distributions in an examination volume enclosing the examination subject. The invention also concerns a magnetic resonance system suitable for implementation of such a method, with a corresponding radio-frequency antenna and a computer program product that can be loaded into a memory of a programmable control device of such a magnetic resonance system for implementation of the method.

2. Description of the Prior Art

Magnetic resonance tomography, also called magnetic resonance tomography apparatus, is a widespread technique for acquisition of images of the inside of the body of a living examination subject. In order to acquire an image with this method, the body or a body part of the patient to be examined must initially be exposed to an optimally homogeneous static basic magnetic field (usually designated as a $B_0$ field) that is generated by a basic field magnet of the magnetic resonance system. During the acquisition of the magnetic resonance images, rapidly-switched gradient fields that are generated by gradient coils are superimposed on this basic magnetic field for spatial coding. Moreover, radio-frequency pulses of a defined field strength are radiated into the examination subject with radio-frequency antennas. The magnetic flux density of these radio-frequency pulses is typically designated with $B_1$. The pulse-shaped radio-frequency field is therefore generally called a $B_1$ field. The nuclear spins of the atoms in the examination subject are excited by means of these radio-frequency pulses such that they are deflected from their equilibrium state (parallel to the basic magnetic field $B_0$) by what is known as an "excitation flip angle" (generally also called a "flip angle"). The nuclear spins then process around the direction of the basic magnetic field $B_0$. The magnetic resonance signals thereby generated are acquired by radio-frequency reception antennas. The reception antennas can be either the same antennas with which the radio-frequency pulses are also radiated, or separate reception antennas. The magnetic resonance images of the examination subject are generated on the basis of the acquired magnetic resonance signals. Each image point in the magnetic resonance image is thereby associated with a small body volume (known as a "voxel") and each brightness or intensity value of the image points is linked with the signal amplitude of the magnetic resonance signal acquired from this voxel. The correlation between a resonant radiated radio-frequency pulse with the field strength $B_1$ and the flip angle α achieved thereby is provided by the equation $$\alpha = \int_{t=0}^{\tau} \gamma \cdot B_1(t) \cdot dt, \quad (1)$$

wherein γ is the gyromagnetic ratio which can be considered as a fixed material constant for most magnetic resonance examinations, and τ is the effective duration of the radio-frequency pulse. Aside from being dependent on the duration of the pulse, the flip angle achieved by the emitted radio-frequency pulse (and thus the strength of the magnetic resonance signal) also depends on the strength of the radiated $B_1$ field. Spatial fluctuations in the field strength of the excited $B_1$ field therefore lead to unwanted variations in the acquired magnetic resonance signal that can adulterate the measurement result.

$$\alpha = \int_{t=0}^{\tau} \gamma \cdot B_1(t) \cdot dt, \quad (1)$$

Especially at high magnetic field strengths (that are inevitably present due to the necessitated basic magnetic field $B_0$ in a magnetic resonance tomography apparatus) the radio-frequency pulses have a non-homogeneous penetration behavior in conductive and dielectric media such as, for example, tissue. This leads to the situation that the $B_1$ field can vary significantly within the measurement volume. In particular in the ultra-high field range with magnetic field strengths $B_0 \geq 3$ T, significant influences of the radio-frequency penetration behavior on the image quality are observed. Due to the $B_1$ focusing and shielding effects, the flip angle of the radio-frequency pulses is a function of the location. Contrast and brightness of the acquired magnetic resonance images therewith vary in the mapped tissue and can lead, in the worst case, to the situation in which pathological structures are not visible.

Multi-channel transmission coils, also called "transmit arrays", are presently considered as a promising approach to the solution of this problem. These are radio-frequency antennas of the aforementioned type that have a number of resonator elements that can be activated individually or in groups. This is possible, for example, when the individual resonator elements are electromagnetically decoupled from one another, and can be separately activated with an individual amplitude and phase via separate radio-frequency channels. Depending on with which amplitudes and phases the different transmission configurations (i.e. the individual resonator elements or groups of resonator elements or transmission modes) are excited, different radio-frequency distributions form in the examination volume of the antenna. For example, with an antenna with N resonator elements that are electromagnetically decoupled from one another and that can be activated individually, it is possible to transmit in N linearly-independent transmission modes which respectively lead to different field distributions.

A simple example of this is a birdcage resonator that has rods that are activated individually with regard to amplitude and phase. Each of these rods generates a $B_1$ field independent of one another, with the $B_1$ fields of the individual rods overlapping to form the total field distribution. Instead of individually considering the single resonator rods, different "collective excitation modes" of the entire birdcage antenna can also be individually excited. One of these modes is, for example, the standard excitation mode of the birdcage resonator (known as the "CP mode") in which the radio-frequency voltage from rod-to-rod varies in terms of the phase by 360°/$N_R$ (wherein $N_R$ is the number of the rods). For higher order collective modes, the voltage then varies, for example, by 2·360°/$N_R$, 3·360°/$N_R$, etc. from rod to rod. For activation of such collective modes, a resident-power mode matrix is installed, for example, in the hardware used for the activation of the antenna elements.

Through individual settings of the amplitude and the phase of the radio-frequency pulse radiated by each transmission configuration (i.e. by each transmission element or each transmission mode), the spatial distribution of the $B_1$ field can be influenced with the goal to generate an optimally homogeneous radio-frequency field in the subject or, respectively, in the examination volume. Magnetic resonance systems of this type are, for example, specified in U.S. Pat. No. 6,043,658 and DE 10 2004 045 691 A1.

A significant, and as of yet largely unresolved, step in this context is the determination of the optimal individual transmission parameters, i.e. of the transmission amplitudes and transmission phases for the individual transmission configurations. Previous approaches for determination of optimized transmission parameters have been based either on simulations, such as in DE 10 2004 045 691 A1. For this purpose, a body model is required in order to simulate the radio-frequency penetration behavior and to be able to calculate the required parameters. A subject-specific optimization (i.e. an optimization that is directly adapted to the current examination subject), however, is therewith not possible. Alternatively, the absolute $B_1$ distribution of every single transmission element can be measured per slice. This does in fact allow an object-dependent adjustment, but these measurements are extraordinarily time-consuming. Approximately 10 sec. per transmission configuration and per slice acquisition are presently required. For six transmission configurations and 10 slices, this leads to an adjustment time of 10 minutes. This method is thus not practical in practice as an adjustment method.

SUMMARY OF THE INVENTION

An object of the present invention is to allow the radio-frequency field distributions that occur with a wide variety of transmission configurations in magnetic resonance tomography to be quickly determined so that the optimal, individual parameters for subsequent MR measurements can be determined on the basis of these values.

In accordance with the invention for determination of the radio-frequency distribution for the various transmission configurations, this object is achieved by implementing the following steps (with the order of the first two steps being arbitrary):

1) Magnetic resonance measurements are implemented to generate magnetic resonance images of the appertaining volume region of the examination subject with the various transmission configurations. The reception configuration of the reception antenna (which can be the same antenna as the transmission antenna) for measurement of the image signals arising for the magnetic resonance measurements is identical in all implemented magnetic resonance measurements. Moreover, all magnetic resonance measurements for the various transmission configurations are implemented with a specific pulse sequence, which is selected such that the function that generally specifies the dependency of the image signal at a specific location on the flip angle achieved at this location with the radiated radio-frequency field, as well as on further MR-relevant parameters (such as the local spin density or the relaxation times) can be factored into at least two sub-functions. The first sub-function that describes the dependency of the image signal on the achieved flip angle and the second sub-function that describes the dependency of the image signal on the further MR-relevant parameters.

2) An absolute flip angle distribution in at least one specific volume region within the examination subject is measured for a "reference transmission configuration". Suitable methods for this are known to those skilled in the art, for example from United States Patent Application Publication Nos. 2005/0073304 A1 and 2004/0164737 A1. The reference transmission configuration can be an arbitrary transmission configuration selected from the possible linearly-independent transmission configurations; the CP mode is advantageously utilized as a reference transmission configuration.

3) The flip angle distributions of the other transmission configurations, i.e. of the transmission configurations which do not correspond to the reference transmission configuration, are then respectively determined on the basis of the absolute flip angle distribution of the reference transmission configurations and on the basis of the ratio of the spatially-dependent image signals of the magnetic resonance measurements of the respective transmission configuration to the corresponding spatially-dependent image signals of the magnetic resonance measurement of the reference transmission configuration. For the determination of the absolute flip angle distributions of the various transmission configurations, it is sufficient to consider the mathematical ratio of the amplitudes of the complex image signals measured with the appertaining transmission configuration to the amplitudes of the complex image signals measured with the reference transmission configuration.

The flip angle $\alpha$ measured at a specific location is representative for the $B_1$ field radiated at that location, the dependency being provided by equation (1). This means that an arbitrary conversion can be made from a flip angle distribution into a $B_1$ field distribution and vice versa using this equation (given knowledge of the employed pulse). The terms "flip angle distribution" and "$B_1$ field distribution" and "radio-frequency field distribution" are therefore used synonymously herein. The determination of a radio-frequency field distribution is accordingly also equated with a determination of the corresponding flip angle distribution and vice versa in the sense of the explanation herein.

The invention is based on the essential realization that the measurement of the absolute $B_1$ amplitude or of the flip angle is only necessary for a reference transmission configuration, i.e. for one transmission element or one transmission mode. For all other transmission configurations, the determination of the $B_1$ amplitude or of the flip angle $\alpha$ relative to the reference transmission configuration is sufficient. The method is thereby significantly accelerated.

Mathematically, the mode of operation of the inventive method can be explained as follows:

The amplitude $S^A$ of the complex image signal S at a location r (r being a vector) is generally linked by the sensitivity profile R of the reception coil and the flip angle $\alpha$ according to the following equation:

$$S^A(r)=R(r)T(\alpha(r),f(r)) \qquad (2)$$

The parameter f here encompasses all MR-relevant parameters, for example the local spin density, the relaxation times $T_1$ and $T_2$ etc. The function T generally describes the complex dependency of the generated magnetization on these parameters as well as on the flip angle $\alpha$, which should be treated separately. In general, more than one radio-frequency pulse or flip angle can naturally also be used in a sequence, but this does not alter the equation since the spatial distribution of the pulse amplitude in the subject is always identical.

If a sequence is now selected for the measurement in accordance with the invention such that a factorization of the total function T is possible, this can be mathematically expressed as follows:

$$T(\alpha(r),f(r))=T_a(\alpha(r))\cdot T_b(f(r)) \qquad (3)$$

For example, relaxed spin echo or gradient echo sequences (i.e. spin echo or gradient echo sequences in which the repetition time $T_R$ is much larger than the relaxation time $T_1$) belong to the pulse sequences in which such a factorization of the total function T into two sub-functions $T_a$ and $T_b$ is possible. Sequences known as EPI sequences (EPI=echo planar imaging), in particular FID-EPI sequences (FID=free induction decay) or SE-EPI sequences (SE=spin echo) can likewise be used. A significant advantage of these acquisition techniques is the short acquisition duration. Still more imaging techniques known to those skilled in the art are likewise suitable, such as, for example, segmented EPI or sequences known as spiral sequences.

Moreover, according to the invention it must be heeded that the sub-function $T_a(\alpha(r))$ must be known. This is fortunately the case in many sequences. For example, given a relaxed gradient echo sequence or given a FID-EPI sequence:

$$T_a(\alpha(r))=\sin(\alpha(r)) \qquad (4)$$

Given a relaxed spin echo sequence or given an SE-EPI sequence with the pulse scheme "α-β-echo" (with the excitation flip angle α and the refocusing flip angle β), it applies that:

$$T_a([a]\alpha(r), \beta(r)) = \frac{1}{2}\cdot\sin([a]\alpha(r))\cdot(1-\cos(\beta(r))) \qquad (5)$$
$$= \sin([a]\alpha(r))\cdot\sin^2\left(\frac{\beta(r)}{2}\right)$$

If an image is now acquired in accordance with the invention for each transmission configuration i (inclusive of the transmission configuration i=k) with the selected sequence, $$S_i^A(r)=R(r)\cdot T_a(\alpha_i(r))\cdot T_b(f(r)) \qquad (6)$$

is obtained for each transmission configuration.

This same equation also applies for the reference transmission configuration (with i=k), for which the flip angle distribution $\alpha_k(r)$ was measured once in accordance with the invention.

The ratios of the amplitudes of the image signals of the individual transmission configurations i≠k to those of the reference transmission configuration k are consequently independent of reception profile and of the local MR-relevant parameters:

$$\frac{S_i^A(r)}{S_k^A(r)} = \frac{T_a(\alpha_i(r))}{T_a(\alpha_k(r))} \qquad (7)$$

The absolute flip angle $\alpha_i(r)$ of each transmission configuration i≠k thus can be determined as follows from the independently-determined absolute flip angle $\alpha_k(r)$ of the reference configuration (k) and the measured image signals as well as the correlation known according to equation (7):

$$\alpha_i(r) = T_a^{-1}\left(T_a(\alpha_k(r))\cdot\frac{S_i^A(r)}{S_k^A(r)}\right) \qquad (8)$$

wherein $T_a^{-1}$ designates the inversion of the function $T_a$, thus (for example) $T_a^{-1}$=arcsin for $T_a$=sin. The flip angle distributions for all other transmission configurations can thus be calculated very quickly by means of equation (8).

In addition to a radio-frequency antenna described above with a number of resonator elements (that can be activated individually or in groups) as well as an antenna activation device in order to excite the resonator elements individually or in groups in different transmission configurations for generation of linearly-independent radio-frequency distributions in an examination volume enclosing an examination subject, an inventive magnetic resonance system must include the following further components:

A measurement sequence control unit that initiates the implementation of magnetic resonance measurements with the various transmission configurations for determination of flip angle distributions for various transmission configurations in at least one specific volume region within an examination subject. As described above, the reception configuration of the reception antenna is identical for all magnetic resonance measurements; and wherein all magnetic resonance measurements for the various transmission configurations are implemented with the pulse sequence suitably selected according to the above explanation.

A flip angle distribution measurement unit in order to determine the absolute flip angle distribution in at least the specific volume region within the examination subject for a reference transmission configuration. For this purpose, the flip angle distribution measurement unit can advantageously influence the measurement sequence control unit insofar as that suitable measurement sequences are radiated for measurement of the absolute flip angle distribution.

A flip angle calculation unit which, on the basis of the absolute flip angle distribution of the reference transmission configurations and on the basis of the ratio of the spatially-dependent image signals of the magnetic resonance measurements of the other transmission configurations, respectively determines the flip angle distribution of the other transmission configurations relative to the corresponding, spatially-dependent image signals of the magnetic resonance measurement of the reference transmission configuration.

The antenna activation device, the measurement sequence control unit, the flip angle distribution measurement unit and the flip angle distribution calculation unit are advantageously integrated at least in part into the typical system control device that moreover is also used to control the magnetic resonance system. The antenna activation device, the measurement sequence control unit, the flip angle distribution measurement unit and the flip angle distribution calculation unit also can be fashioned in multiple parts, i.e. various modules that for example, are integrated into different components of the system control device. The realization advantageously ensues in the form of one or more software modules that can be called as an antenna control program, a measurement sequence control program, a flip angle distribution measurement program or a flip angle distribution calculation program, within a computerized control device of the magnetic resonance system. As used herein a "computerized control device" means a control device that is equipped with a suitable processor as well as further components in order to execute the control, measurement and/or calculation programs that are provided.

Since, as described above using equation (8), the inverse function $T_a^{-1}$ of the function $T_a(\alpha(r))$ is used that describes the dependency of the image signal S(r) on the flip angle $\alpha(r)$, in the implemented magnetic resonance measurements in the various transmission configurations it should be insured that nowhere in the generated images does a local flip angle $\alpha(r)$ result outside of the region in which the inverse function $T_a^{-1}$ is unique. For the experiments in which, for example, the functional correlation results according to equation (4) by a simple sine function (as given a simple relaxed gradient echo sequence or an FID-EPI sequence), it should be ensured that the flip angle $\alpha(r)$ in the acquired MR images is maximally 90°. An estimation for the measurement flip angle normally can be obtained in advance without problems, so that it can be ensured that the flip angle always remains within the unambiguous range. For this purpose, for example, the simple and fast methods described in United States Patent Application Publication 2005/0073304 A1 can be used for determination of an average $B_1$ field within a slice to be measured by means of a double echo method, without spatial resolution. If the average $B_1$ field is known and it is also assumed that the maximum $B_1$ field within a slice exceeds the average by not more than a specific factor, for example a factor of 2, the measurement flip angle can be concluded and a suitable field can be radiated for the magnetic resonance measurement, such that the flip angle safely remains in the unambiguous range. For example, for an FID-EPI measurement, and an SE-EPI measurement the excitation flip angles in the measurements can be set to 45° in order to make sure that the maximum flip angle is no more than 90°.

As described above, the optimal phase for the individual transmission configurations is required as a further transmission parameter. To determine the optimal transmission parameters, the phasing of the radio-frequency distribution of the various transmission configurations relative to one another are advantageously determined on the basis of the phasing of the image signals that were determined in the implemented magnetic resonance measurements with the various transmission configurations. This is very simple in the inventive method since the required phasing $\phi_i(r)$ (related to the reference phase position $\phi_k(r)$) can be automatically determined from the phase of the image signals $S_i(r)$ and $S_k(r)$. It is only important that in both cases (as is inventively the case anyway) the same reception configuration is used, such that the reception phases have no influence. Furthermore, the correlation of the phasing of the RF pulse or, respectively, RF pulses and of the detected magnetic resonance signal must be known. For a simple gradient echo, for example an FID-EPI sequence, $$\phi_i(r)-\phi_r(r)=\text{Arg}(S_i(r))-\text{Arg}(S_k(r)) \quad (9)$$

wherein S(r) is the complete, complex image signal and the Arg function extracts the phase from this image signal. Similar correlations are found in the spin echo sequences, independent of which radio-frequency pulse is individually applied with the respective transmission configuration i.

For this purpose, a magnetic resonance system in accordance with the invention requires a suitable phase determination unit that, for example, can be a part of the flip angle calculation unit.

Insofar as multi-pulse sequences (for example spin echo sequences) are used for implementation of the magnetic resonance measurement with the various transmission configurations, advantageously only one pulse of the sequence is emitted with the appertaining transmission configuration and the other pulses of the sequence are emitted with the reference transmission configuration. The signal/noise ratio can thereby be improved. For a multi-pulse sequence with an excitation pulse and a refocusing pulse, the excitation pulse is preferably emitted with the appertaining transmission configuration and the refocusing pulse is emitted with the reference transmission configuration in order to avoid phase ambiguities.

To accelerate the method, the magnetic resonance measurements are preferably implemented in an interleaved multi-slice acquisition method (known as an "interleaved" measurement method). In such an interleaved slice acquisition mode, the measurement time in the ideal case can be reduced to the fraction $1/N_S$ ($N_S$=number of the slices). In such a slice measurement, in order to avoid the problem that the signals result as integrals over the flip angle distribution in the respective slice along the slice normals, multi-pulse sequences with at least one excitation pulse and one refocusing pulse are advantageously used for these measurements. One of the pulses is emitted slice-selectively and the other pulse is emitted weakly slice-selectively, for example with double the slice width. The refocusing pulse is preferably the pulse that is emitted slice-selectively.

The distribution along the slice normals that is relevant for the flip angle determination is therewith significantly reduced. Nevertheless, multi-slice acquisitions are possible. This method can also be advantageously used in the one-time determination of the absolute flip angle for the reference transmission configuration.

Moreover, the inventive measurement allows the generation of a homogeneous radio-frequency distribution in at least one specific volume region within an examination subject in a magnetic resonance system; the magnetic resonance system having a radio-frequency antenna with a number of resonator elements that can be excited individually or in groups for generation of linearly-independent radio-frequency distributions in an examination volume in which the examination subject is located. For this purpose, according to the inventive method described above only the flip angle distribution in the specific volume region must be initially determined for the various transmission configurations. A determination of the optimal transmission amplitudes for the individual transmission configurations can subsequently ensue on the basis of the determined flip angle distribution. This means that a radio-frequency pulse excitation profile in which the radio-frequency field distribution exhibits a specific shape is determined on the basis of the measured flip angle distribution or radio-frequency field distributions. The excitation in a later MR measurement then ensues according to the determined radio-frequency pulse excitation profile.

For this purpose the inventive magnetic resonance system has a parameter optimization unit that, on the basis of the determined flip angle distribution, determines the optimal transmission amplitudes for the individual transmission configurations for generation of a homogeneous magnetic radio-frequency field distribution in at least the specific volume region of the examination subject, on the basis of which the antenna activation device activates the resonator elements in a subsequent magnetic resonance measurement.

The inventive method for generation of a homogeneous magnetic radio-frequency distribution can be used both in an activation of individual resonator elements and in a group-by-group activation of the resonator elements in established transmission modes, for example by means of a resident-power mode matrix. For simplicity, however, in the scope of the invention an activation of the individual resonator elements is primarily discussed for the most part which, is to be equated with an activation of groups of resonator elements that are coupled via a corresponding mode matrix.

Moreover, for the various transmission configurations the phase positions of the radio-frequency field distributions of the various transmission configurations are also advantageously determined relative to one another as previously described, and a determination of the optimal transmission phases for the individual transmission configurations then ensues on the basis of the determined phase positions. The parameter optimization unit must be correspondingly fashioned for this purpose so that it can determine the optimal transmission phases for the individual transmission configurations on the basis of the determined phase positions.

One possibility for calculation of the optimal transmission parameters for individual transmission configurations from the determined $B_1$ field distribution or the flip angle distribution and the determined phase positions is described by D. Diehl, U. Weinert, E. Bijick, R. Lazar and W. Renz in "$B_1$ Homogenization at 3T MRI Using a 16 Rung Transmit Array", Proceedings of the ISMRM, 13th Meeting, Page 2751, 2005. For example, if one is limited to the minimization of the homogeneous function $f_1$ (for example the standard deviation of $B_1$ within the examination volume), only the spatial distribution of the $B_1$ fields generated by the individual transmission configurations is required as input information. This information can be acquired from FDTD simulations with a body model, but information acquired from a measurement obviously represents the better database due to the strong dependency of the $B_1$ field distribution on the detailed body structure and geometry. The inventive method enables the acquisition of corresponding measurement data. The calculation of the optimal amplitudes and phases of the currents $I_1, I_2, \ldots I_N$ of the individual transmission configurations then turns out to be a standard optimization problem that can be solved by those skilled in the art with known methods from the numerical mathematics. The simultaneous consideration of a second optimization function $f_2$ with which, for example, the SAR is kept optimally low, is likewise possible.

By the use of the inventive method a subject-specific optimization of the transmission parameters of a transmit array within an acceptable time span is now possible for the first time. Given use of faster acquisition techniques (such as, for example, an EPI method), the time expenditure for the adjustment method can lie in the range of less than 20 sec. inclusive of the determination of the absolute reference flip angle.

DESCRIPTION OF THE DRAWINGS

FIG. 2 is a pulse sequence for parallel, spatially-resolved measurement of a number of slices.

FIG. 4 schematically illustrates an inventive magnetic resonance system in accordance with the invention.

DESCRIPTION OF THE PREFERRED EMBODIMENTS

Figure 1:
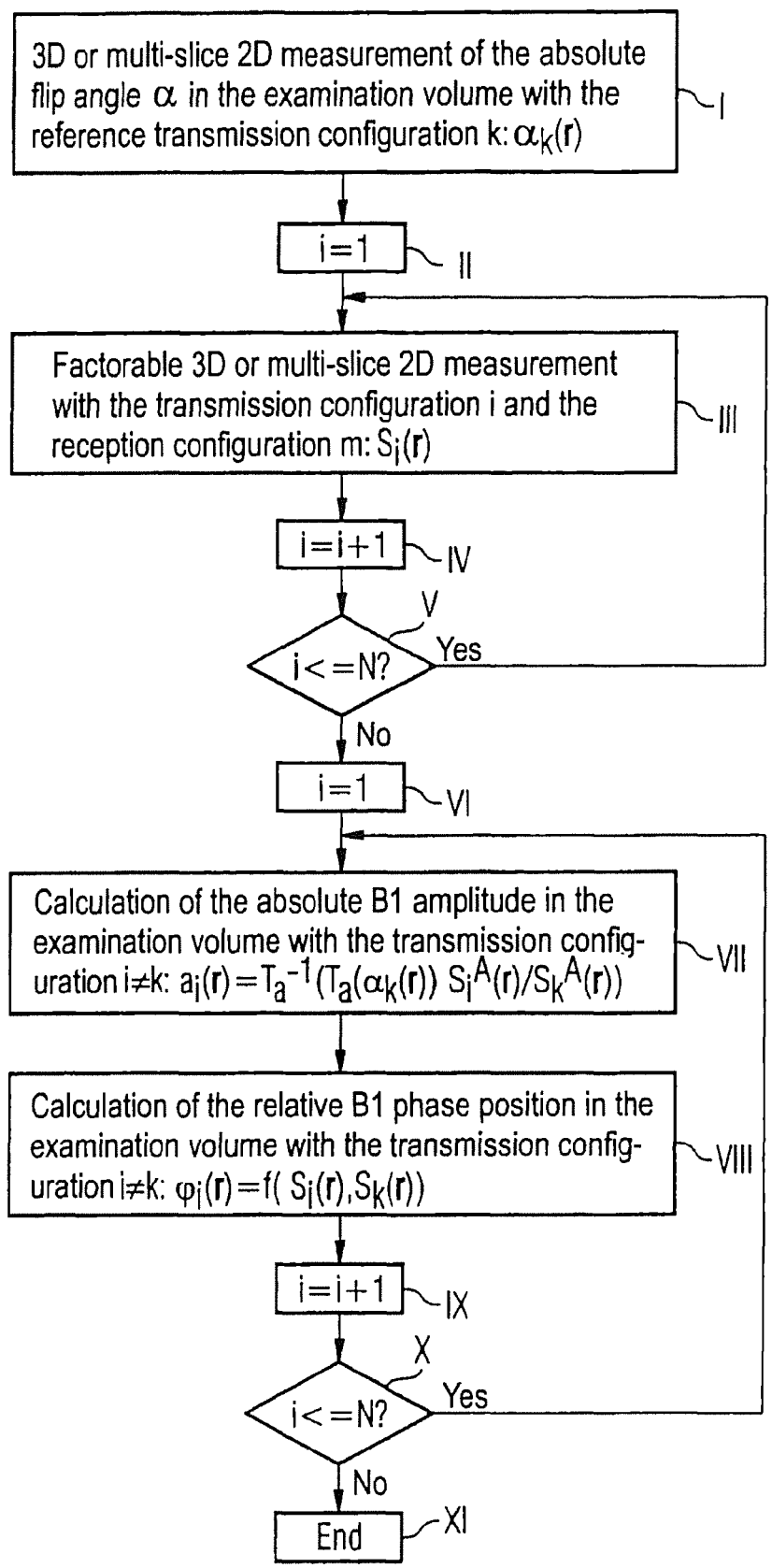
FIG. 1 is a flow chart of an embodiment of the inventive method.

A possible measurement and calculation process according to an embodiment of the inventive method is shown in FIG. 1 using a workflow plan.

In step I the absolute flip angle distribution $\alpha_k(r)$ in the examination volume is thereby initially measured with the reference transmission configuration k with a three-dimensional or multi-slice two-dimensional method. This can ensue, for example, with the method described in United States Patent Application Publication 2005/0073304 A1 or 2004/0164737 A1. Subsequently, a control variable i is initially set to 1 in step II. In a subsequent loop the factorizable three-dimensional or multi-slice two-dimensional measurements are then respectively implemented with all transmission configurations i=1 through N (as already described above). The result are magnetic resonance images, wherein the spatial image signal distribution can be designated as $S_i(r)$. The same reception configuration should thereby respectively be selected.

The control variable i is incremented by 1 in step IV and in step V the query then ensues as to whether the control variable i has reached the number of the possible transmission configurations N. If this is not the case, in a step III for the new transmission configuration i+1 a new image is acquired in order to obtain the distribution $S_{i+1}(r)$. In step IV the variable is then again incremented by 1.

If it is established in step V that the magnetic resonance measurements have been conducted for all N possible transmission configurations, the control variable i is initially reset to 1 (step VI).

Subsequently, in a further loop which comprises the method steps VII, VIII and XI the absolute flip angle distribution in the examination volume is respectively initially calculated with the transmission configuration i according to the equation (9). In step IX the calculation of the relative $B_1$ phase position in the examination volume of the transmission configuration i subsequently ensues corresponding to $\phi_i(r) = f(S_i(r), S_k(r))$.

In step IX the control variable i is again increased by 1 and in step X it is queried whether the loop has already been run through for all transmission configurations i=1 through N. Otherwise a return to the method step VII ensues. If it is established in step X that the control variable i corresponds to the number N of the maximum linearly-independent transmission configuration, the method is ended in the step XI.

On the basis of the flip angle distributions and phase positions so acquired for the individual transmission configurations, the optimal transmission parameters for activation of various reception configurations (for example of the individual resonator elements) can subsequently be determined very quickly with the methods already known, such that a homogeneous $B_1$ field can be generated within the relevant volume of the examination subject.

In the pulse sequence scheme shown in FIG. 2 the radio-frequency pulses emitted by the radio-frequency transmission antenna and the various gradient pulses (temporally dependent on the radio-frequency pulses) appropriately switched are shown in a typical manner on parallel time axes.

The radio-frequency pulses emitted by the radio-frequency transmission antenna are shown on the upper three axes with the designations $RF_1$, $RF_2$, $RF_3$ (RF=radio frequency). The upper axis $RF_1$ thereby shows the emission of the pulses with a first transmission configuration, the second axis $RF_2$ shows the emission of pulses with a second transmission configuration, and the third axis $RF_3$ shows the emission of the pulses with a third transmission configuration. Here the first transmission configuration is adopted as a reference transmission configuration, but in principle any other transmission configuration can be selected as a reference transmission configuration. Naturally the pulse scheme according to FIG. 2 can be arbitrarily expanded [extended] by still further transmission configurations.

The gradient GS shown below this is known as the slice-selection gradient which, for example, is applied in the z-direction and provides for a selection of a specific slice upon excitation of the spins. Located below this is as the phase coding gradient (phase encoding gradient) GP which provides for a phase coding. This phase coding gradient is very quickly switched through various values during a measurement. The third gradient GR is what is known as the readout or frequency encoding gradient which is applied in order to read out frequency-coded signals in a specific slice. Overall, a spatially-resolved measurement of signals within the slice determined (as well) by the slice-selection gradient GS can ensue via corresponding switching of the phase coding gradient GP and readout gradient GR. The precise workflow of the phase coding and frequency coding for spatially-resolved measurement within a slice as well as the representation in such a sequence scheme are known to those skilled in the art and are therefore not explained in further detail here. The signal actually measured by the ADC (analog-digital converter) is shown on the lowermost time axis.

An SE-EPI radio-frequency pulse sequence is shown concretely in FIG. 2. For spatially-resolved measurement a weakly slice-selective first excitation pulse $RFA_1$ is initially emitted via the radio-frequency antenna, which first excitation pulse $RFA_1$ provides that the spins are tilted by a specific flip angle in a precisely defined slice, for example perpendicular to the field direction of the $B_0$ field (z-direction). The slice selection is achieved in that, on the one hand, a gradient pulse $GSP_A$ acting in the z-direction is emitted parallel to the emission of the radio-frequency pulse $RFA_1$ and the frequency and the shape of the excitation pulse $RFA_1$ is selected in a suitable manner. The precise effect of such a weakly slice-selective pulse is subsequently explained in detail using FIGS. 3a through 3c.

A short negative gradient pulse GRP follows the first slice gradient pulse $GSP_A$ (which is required for slice selection for the excitation pulse $RFA_1$) in order to again reset (rephasing pulse) the unwanted dephasing of the magnetization that is inevitably generated by the slice gradient pulse $GSP_A$.

The second pulse within such a pulse sequence $PS_1$ is a refocusing pulse $RFR_1$ which is emitted slice-selectively. A further gradient pulse $GSP_R$ is emitted in order to achieve the slice selection.

Pre-dephasing pulses KDP, VDR are set in the phase coding gradient GP and in the readout gradient GR parallel to the rephasing pulse GRP in the slice gradient GS.

After the refocusing pulse $RFR_1$ has been set, a series of, for example, triangular phase coding pulses PKP is set after the provided time in the phase coding gradient GP, wherein at the same time an alternating readout gradient pulse AGP is set in the readout gradient GR. The signal is read parallel to this at the ADC.

Figure 3A:
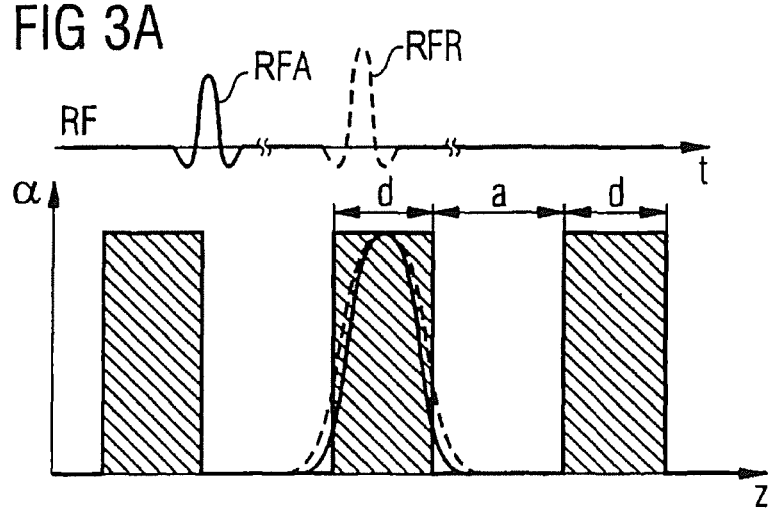
FIG. 3a illustrates a slice-selective excitation pulse and a subsequent slice-selective refocusing pulse on the time axis (upper diagram) and the associated slice profile, i.e. the flip angle as a function of the location along the slice selection axis z (lower diagram).
Figure 3B:
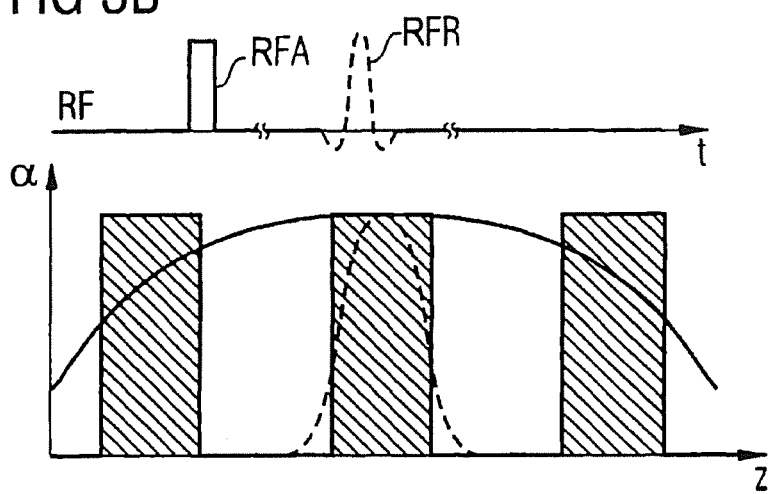
FIG. 3b illustrates a non-slice-selective excitation pulse and of a subsequent slice-selective refocusing pulse on the time axis (upper diagram) and the associated slice profile, i.e. the flip angle as a function of the location along the slice selection axis z (lower diagram).
Figure 3C:
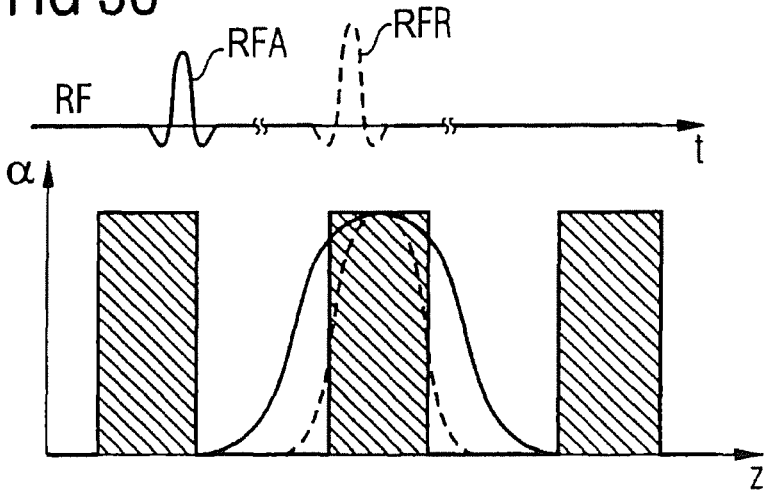
FIG. 3c illustrates a weakly slice-selective excitation pulse and of a subsequent slice-selective refocusing pulse on the time axis (upper diagram) and the associated slice profile, i.e. the flip angle as a function of the location along the slice selection axis z (lower diagram).

This pulse sequence $PS_1$ for the acquisition in the first transmission configuration i=1 can then be repeated for each individual slice. In order to reduce the time duration for the measurement of a large volume, however, a number of radio-frequency excitation pulses can also be emitted under switching of a corresponding slice-selective gradient GS in an interleaved manner. The implementation of such a multi-slice method is known to the average man skilled in the art and does not need to be explained here in detail. However, it should be insured that in such a multi-slice measurement it is ensured that, on the one hand, the individual pulses do not act on the entire volume (meaning that slices are excited that should not be excited in a specific slice measurement) and that, on the other hand, the influence of the flip angle distribution along the slice normals does not adulterate the measurements. FIGS. 3a through 3c are referenced to explain this problem.

An excitation pulse RFA (solid line) is shown on the upper axis RF in FIG. 3a and a refocusing pulse RFR (dashed line) is subsequently shown. Both pulses RFA, RFR are slice-selective pulses, for example in that a sinc function pulse shape is selected. It is assumed that a matching slice gradient pulse is simultaneously emitted. In the graphic arranged below these the slice profiles (i.e. the flip angle α) are plotted as a function of the z-coordinate, wherein here z represents the slice-selection axis. The boxes deposited with grey show the desired or ideal rectangular slice profile for a multi-slice sequence workflow. Here the slices each have a thickness d and an interval a from one another. The solid black line contrarily shows the slice profile excited with the excitation pulse RFA and the dashed line shows the slice profile excited by the refocusing pulse RFR. As FIG. 3a shows, both the excitation pulse RFA and the refocusing pulse RFR are actually selective. The advantage is that both the excitation pulse RFA and the refocusing pulse RFR of a slice do not influence the neighboring slices. Slices situated next to one another can therewith be rapidly measured in succession. The disadvantage, however, is that the flip angle is not constant over the slice to be measured, which makes a quantitative evaluation massively more difficult.

FIG. 3b shows a case in which the excitation pulse RFA is not slice-selective. A rectangular excitation pulse RFA (see upper graphic) is used for this. Only the refocusing pulse RFR is slice-selective (as in FIG. 3a). As the solid line shows in the lower graphic for representation of the slice profiles, the flip angle of the excitation pulse is then constant over the slice to be measured. The neighboring slices are disadvantageously also encompassed by the excitation pulse, such that no fast repetition of measurements of a plurality of slices is possible.

FIG. 3c shows a further variant according to a preferred exemplary embodiment of the present invention. Here a "weakly-selective" excitation pulse RFA is emitted. The refocusing pulse RFR is again slice-selective for slice localization, as in FIGS. 3a and 3b. As the solid line in the lower graph of FIG. 3c shows, the weakly-selective excitation pulse RFA results in the neighboring slices not being influenced, but at the same time the flip angle of the excitation pulse RFA is nearly constant across the slice. The precise shape of the excitation pulse must be selected dependent on the interval a between two slices. A slice interval a which approximately corresponds to the slice thickness d is by all means reasonable for the inventive measurements to be implemented.

As FIG. 3c shows, in the inventive method it is thus possible without further measures to conduct the measurements very quickly in a multi-slice method by suitable selection of a weakly slice-selective excitation pulse RFA and a subsequent slice-selective refocusing pulse RFR.

The emission of the pulse sequence $PS_2$ for the magnetic resonance measurement with the second antenna configuration is shown in FIG. 2. As a comparison with the first pulse sequence $PS_1$ shows, this measurement differs merely in that the weakly slice-selective excitation pulse $RFA_2$ is emitted here with the second transmission configuration. The associated slice-selective refocusing pulse $RFR_2$ is emitted precisely as in the first pulse sequence $PS_1$ with the reference configuration i=1. The switching of the slice gradients, the phase coding gradients and the readout gradients GR also does not differ from the pulse sequence $PS_1$ for measurement of the first transmission configuration.

The same analogously applies for the pulse sequence $PS_3$ for the third transmission configuration. Here as well only the excitation pulse $RFA_3$ with the third transmission configuration i=3 is emitted, and the associated refocusing pulse $RFR_3$ is emitted with the first transmission configuration.

As described above for the first transmission configuration, the pulse sequences $PS_2$, $PS_3$ for magnetic resonance measurement of the second transmission configuration and the third transmission configuration can be developed for implementation of a multi-slice method.

FIG. 4 shows a simple basic block diagram of an exemplary embodiment of a magnetic resonance apparatus 1 with which the inventive method can be implemented.

The core of this magnetic resonance system 1 is a data acquisition device 3 (also called a "scanner") in which is positioned a patient O on a bed 8 in an annular basic field magnet. A radio-frequency antenna 6 for emission of the MR radio-frequency pulses is located within the basic field magnet.

The antenna 6 has N resonator elements 7 that can be individually activated with radio-frequency pulses $RF(A_1, \theta_1), RF(A_2, \theta_N), \ldots, RF(A_N, \theta_N)$. For example, this can be an antenna design as described in U.S. Pat. No. 6,043,658 or in DE 10 2004 045 691 A1.

The data acquisition device 3 is activated by a system control device 2, shown separately. A terminal 4 as well as a bulk storage 5 are connected to the system control device 2. The terminal 4 serves as a user interface via which an operator operates the system control device 2 and therewith the data acquisition device 3. The bulk storage 5 serves to store images acquired, for example, by means of the magnetic resonance system. The terminal 4 and the storage 5 are connected with the system control device 2 via an interface 16.

The system control device 2 has an antenna activation device 9 that is connected with the tomograph 3 and which outputs the radio-frequency pulses with the suitable amplitudes and phases for the individual resonator elements 7 corresponding to the measurement sequence protocol provided by the system control device 2.

Moreover, the system control device 2 is connected with the data acquisition device 3 via an interface 10. The measurement data coming from the tomograph 3 are acquired via the interface 10 and assembled into images in a signal evaluation unit 11, which images are then (for example via the interface 16) displayed at the terminal 4 and/or stored in the storage 5.

Both the system control device 2 and the terminal 4 and the storage 5 can be integral components of the data acquisition device 3. The system control device 2 can be formed of a number of individual components. For example, the antenna activation device 9 can be fashioned as a separate unit connected with the system control device 2 via a suitable interface.

The entire magnetic resonance apparatus 1 also includes all further typical components or features such as interfaces for connecting to a connection network (for example an image information system (picture archiving and communication system, PACS). For clarity, these components are not shown in FIG. 4.

The operator can communicate with the measurement sequence control unit 13 in the system control device 2 via the terminal 4 and the interface 16. This measurement sequence control unit 13 then provides suitable pulse sequences to the antenna activation device 9 and a gradient coil activation device 17 with which the gradients are appropriately controlled. This means that the measurement sequence control unit 13 provides for an emission of the matching radio-frequency pulse sequences via the antenna 6 and for a suitable switching of the gradients in order to implement the desired measurements.

Here the inventive magnetic resonance apparatus 1 has flip angle distribution measurement unit 12 as part of the system control device 2. According to a corresponding command via the terminal 4 and/or wholly automatically within an examination program workflow, this flip angle distribution measurement unit 12 provides that the emission of pulse sequences for measurement of an absolute flip angle distribution is initially initiated for a reference transmission configuration of the antenna 6. The magnetic resonance signals thereby measured are in turn passed from the signal evaluation unit 11 to the flip angle distribution measurement unit 12 which correspondingly evaluates these in order to determine the absolute flip angle distribution.

Moreover, the measurement sequence control unit 13 inventively allows magnetic resonance exposures to be generated for all transmission configurations i=1 through N, as explained in detail above. The image signals thereby arising are likewise accepted by the signal evaluation unit 11 and the magnetic resonance images are passed to a flip angle calculation unit 14. This flip angle calculation unit 14 moreover receives from the flip angle distribution measurement unit 12 the absolute flip angle distribution $\alpha_k(r)$ for the reference transmission configuration k. According to the inventive method, the absolute flip angle distribution for all transmission configurations i=1 through N can be determined within the flip angle calculation unit.

Moreover, using the magnetic resonance measurements the relative phasing of the radio-frequency field distributions in the various transmission configurations relative to one another is determined in a phase determination unit 14a which here is a sub-module of the flip angle calculation unit 14.

These values, the determined flip angle distributions and the determined relative phasings, are then passed to a parameter optimization unit 15 which, on the basis of these values, determines the optimal amplitudes $A_1, A_2 \ldots A_N$ and the optimal phases $\theta_1, \theta_2, \ldots, \theta_N$ for the individual resonator elements 7 for a subsequent magnetic resonance measurement. The optimal transmission parameters are then passed to the measurement sequence control unit 13 that provides that the antenna activation device 9 correspondingly activates the antenna elements 7.

At least the measurement sequence control unit, the flip angle distribution measurement unit 12, the signal evaluation unit 11, the flip angle calculation unit 14 and the parameter optimization unit are normally realized in the form of software modules on a processor of the system control device 2. The realization purely as software has the advantage that already-existing magnetic resonance systems can also be upgraded (retrofitted) via a corresponding software upgrade. It is also possible for the units 11, 12, 13, 14, 15 (respectively represented as individual blocks in FIG. 4), or corresponding software modules, are in turn each formed by a multiple components or sub-routines. These sub-routines can also be used by other components of the system control device 2, meaning that if applicable, already-existing sub-routines of other program units are accessed in order to keep the expenditure in the implementation of the modules necessary according to the invention as low as possible.

The method described in detail in the preceding as well as the described magnetic resonance system are only exemplary embodiments that can be modified by those skilled in the art without departing from the scope of the invention. In particular other forms of excitation pulses or sequences of excitation pulses can be used instead of the excitation pulse concretely described. The invention was explained using in the context of a medically-utilized magnetic resonance system, but it is not limited to such applications, and can also be used in scientific and/or industrial applications.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining a flip angle distribution in a magnetic resonance (MR) data acquisition unit having a radio-frequency antenna arrangement that is configurable to form a plurality of different transmission configurations, including a reference transmission configuration, comprising the steps of:

operating said MR data acquisition unit to obtain MR data from a volume in an examination subject located in an examination volume of said MR data acquisition unit, by executing an interleaved multi-slice acquisition procedure comprising an excitation pulse and a refocusing pulse;

in said interleaved multi-slice acquisition procedure, emitting one of said excitation pulse and said reference pulse as a slice-selective pulse and emitting the other of said excitation pulse and said refocusing pulse as a weakly slice-selective pulse;

during said interleaved multi-slice acquisition procedure, configuring said antenna arrangement to form said reference transmission configuration and configuring said antenna arrangement to form a different transmission configuration, other than said reference transmission configuration, respectively, while emitting said excitation pulse and said reference pulse, respectively; and in a computerized processor, determining said flip angle distribution from said MR data, and making said flip angle distribution electronically available in a form for further processing thereof.

2. A method as claimed in claim 1 comprising dividing said volume in said examination subject into a plurality of slices, each having a slice width, and emitting said weakly slice-selective pulse with double said slice width.

3. A method as claimed in claim 1 comprising emitting said refocusing pulse while said antenna arrangement is in said reference transmission configuration.

4. A method as claimed in claim 1 comprising, in said computerized processor, converting said flip angle distribution into a radio-frequency field distribution and determining operating parameters for said antenna arrangement that produce said radio-frequency field distribution.

* * * * *